United States Patent [19]

Hayes, III et al.

[11] 4,348,637
[45] Sep. 7, 1982

[54] PULSE WIDTH SPECTRUM ANALYZER

[75] Inventors: Frank Hayes, III, Huntsville; Joseph R. McGinty, Madison, both of Ala.

[73] Assignee: The United States of America as represented by the Secretary of the Army, Washington, D.C.

[21] Appl. No.: 205,359

[22] Filed: Nov. 10, 1980

[51] Int. Cl.³ ............................................. G01R 23/16
[52] U.S. Cl. ................................. 324/77 B; 324/77 C
[58] Field of Search ................. 324/77 R, 77 B, 77 C, 324/77 CS, 78 D, 79 D, 77 A; 235/92 T

[56] References Cited

U.S. PATENT DOCUMENTS 3,728,623 4/1973 Dubois .............................. 324/77 B
3,769,541 10/1973 Wood ................................ 324/77 B
3,863,161 1/1975 Johnson et al. ................... 324/77 B Primary Examiner—Michael J. Tokar
Attorney, Agent, or Firm—Nathan Edelberg; Robert P. Gibson; Robert C. Sims

[57] ABSTRACT

Each incoming pulse has its width determined and is stored in a designated storage counter in accordance with its pulse width. The contents of the storage counters are serially addressed and the value of each counter is obtained. The value of each counter is used as a Y input to a readout and the serially addressing of the counter is used as the X input of the readout device. The count on counters are maintained within their capacity by sensing when a counter reaches its maximum value and causing all counters to down count in accordance with the input rate to this particular storage counter.

8 Claims, 7 Drawing Figures

PULSE WIDTH SPECTRUM ANALYZER

DEDICATORY CLAUSE

The invention described herein may be manufactured, used, and licensed by or for the Government for governmental purposes without the payment to us of any royalties thereon.

DESCRIPTION OF THE BEST MODE AND PREFERRED EMBODIMENT

The analyzer has been developed to provide a method of characterizing a pulse train from a "pulse width" viewpoint. The circuit could find use in many ways, one of which would be in everyday data reduction efforts when a signal needs to be characterized on a "pulse width" basis.

In operation, the circuit provides an X-Y plot or spectrum, of a typical pulse signal. These pulses can be any combination of varying widths. The spectrum will establish the width of the most commonly sampled pulse and define the width and relative rate of occurrence of any other pulses contained in the signal.

The actual pulse width spectrum consists of an X-axis which is incremented from the minimum to the maximum pulse widths to be analyzed. The only measure of frequency in the spectrum is in the relative occurrence of one particular pulse width to that of another. The dominant, most common pulse width in the signal will receive the greatest Y-axis value or probability of occurrence, whereas all other pulse widths will have Y-values relative to the dominant width. The Y-axis then gives the probability of occurrence of a particular pulse width in a given sample.

Circuitry has also been added to enable displaying the spectrum on a video monitor in addition to the oscilloscope. This added capability enables the user to position the plot in a corner of the screen and observe a real life composite scene simultaneously.

Figure 1:
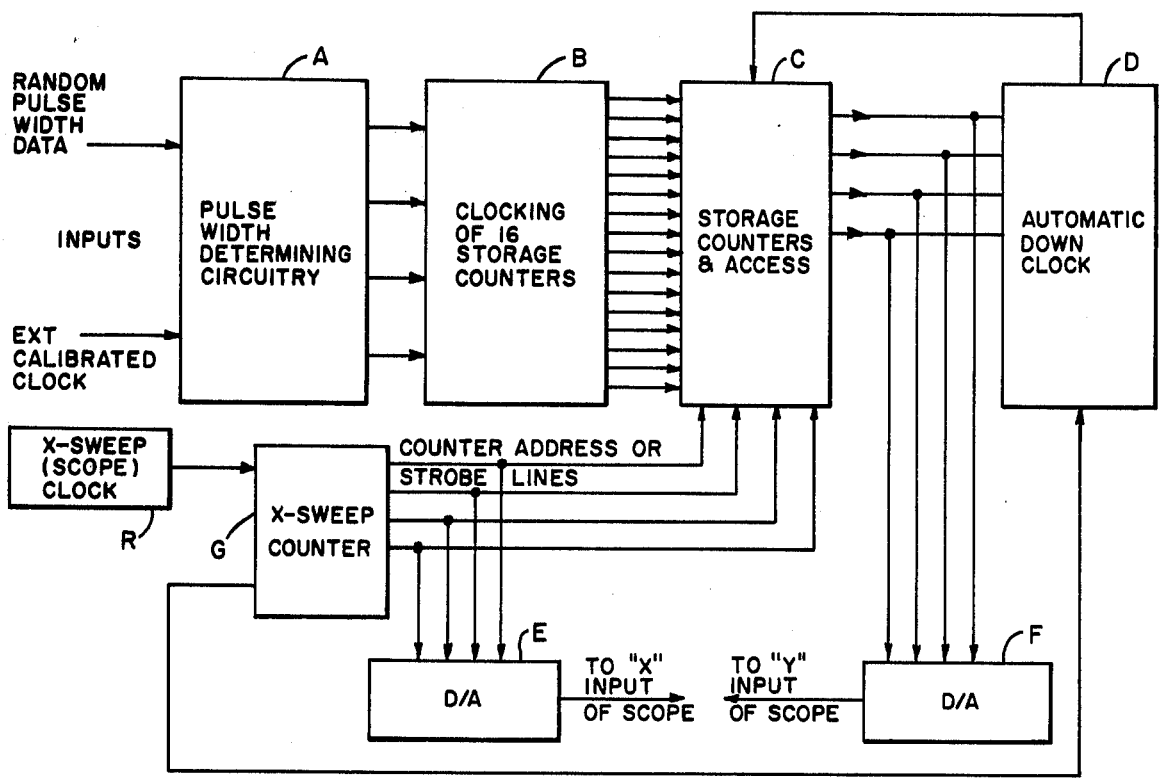
FIG. 1 is a block diagram of the basic invention.

FIG. 1 is a block diagram of the basic circuitry involved in obtaining a pulse width spectrum on an X-Y oscilloscope display. The circuitry operates in this mode with only two external inputs. One is the signal to be analyzed and the second is a calibrated clock used in determining individual pulse widths.

Pulse widths are determined in block A. The outputs of this block include a four-bit binary count specifying the width of a pulse by its magnitude of 0 thru 15 and an enable pulse which strobes block B once per pulse.

Block C contains sixteen individual storage counters, each representing a particular pulse width. When a pulse's binary count has been determined in block A, block B is strobed. Strobing block B clocks one of the storage counters one time. The particular storage counter clocked is determined by the pulse's binary count from block A. Obviously, the storage counter clocked the most will have the highest binary output and represent the dominant pulse width. To prevent all storage counters from reaching their maximum output and stopping, an automatic down clock, block D, was required and operates as a coarse automatic gain control (AGC).

In the scope display mode, an internal oscillator or clock of about 4 KHz is used to generate the "X" axis input to the scope. This oscillator, block R, drives a counter, block G, whose four-bit binary output serves two functions. First it enters a digital-to-analog converter (D/A), block E, and becomes the X-sweep input to the scope, and secondly it addresses each of the sixteen storage counters sequentially and repetitively. When a particular storage counter is addressed its output goes to another D/A converter, block F, and becomes the Y-axis input for the spectrum display.

Figure 2:
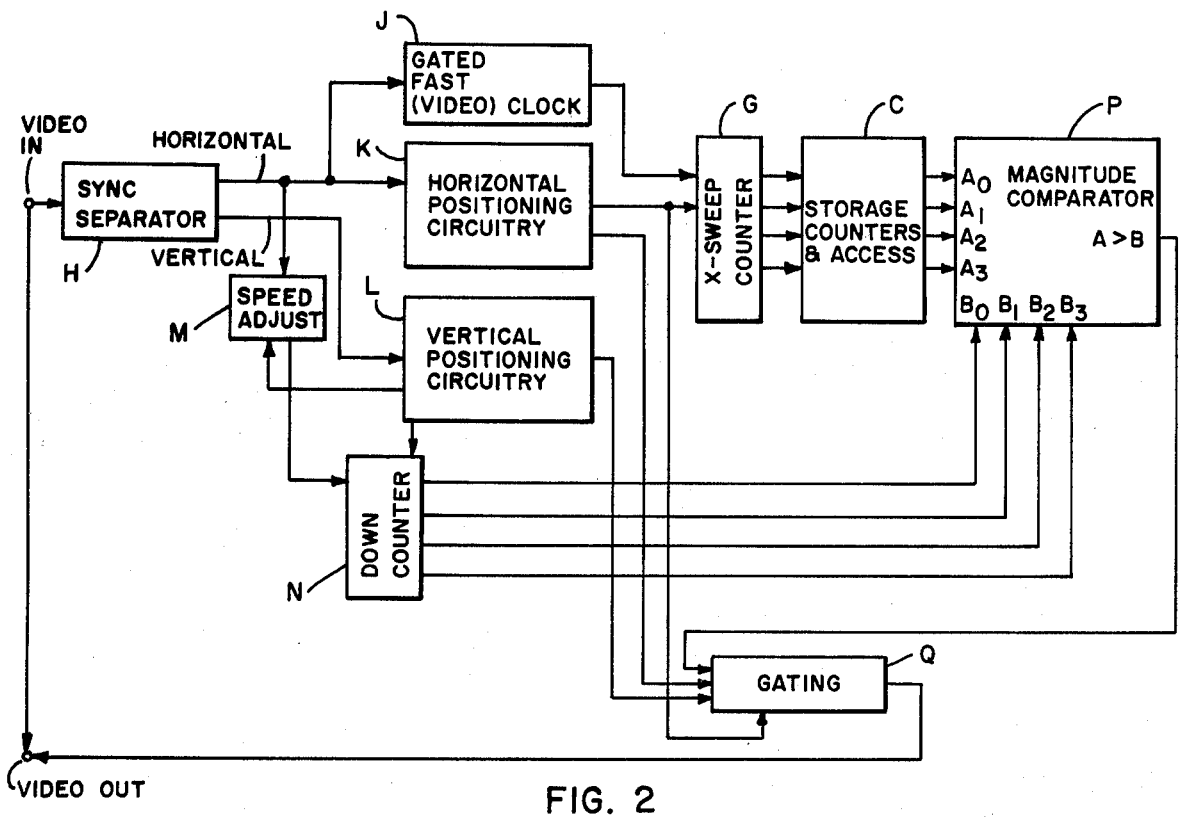
FIG. 2 is a block diagram for additional blocks required for a video display.

FIG. 2 indicates the additional blocks required to provide a video display of the spectrum. Block H serves as a sync separator, providing vertical and horizontal sync pulses from the camera video signal. Using these sync signals, blocks K and L can adjust the horizontal and vertical position of the spectrum to anywhere on the screen.

Another internal oscillator, with a range of 0.5 to 2.0 MHz is gated with the horizontal sync and drives the X-sweep counter, block G, when in the video mode of operation. By varying this oscillator's speed, the width of the spectrum can be changed on the screen.

A divided down horizontal sync signal, derived in block M, is used to increment a down counter in block N. This down counter counts from 15 to 0 repetitively and by varying the clock rate driving it, the overall height of the spectrum display can be changed.

The spectrum is generated by comprising the output of this down counter to the outputs of the addressed storage counters. After each down count, all storage counters are addressed and the comparisons made in block P. Results of this comparison process are sent to block Q where the signal is readied for video insertion.

Figure 3:
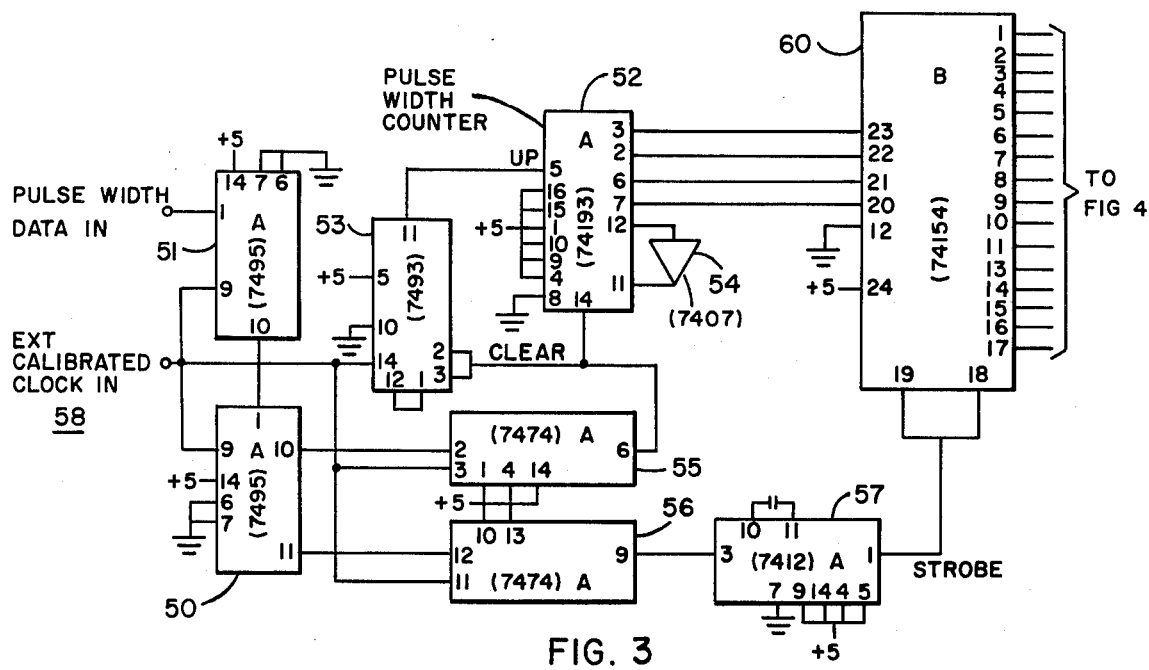
FIg. 3 is a detailed schematic of portions of FIG. 1.
Figure 4:
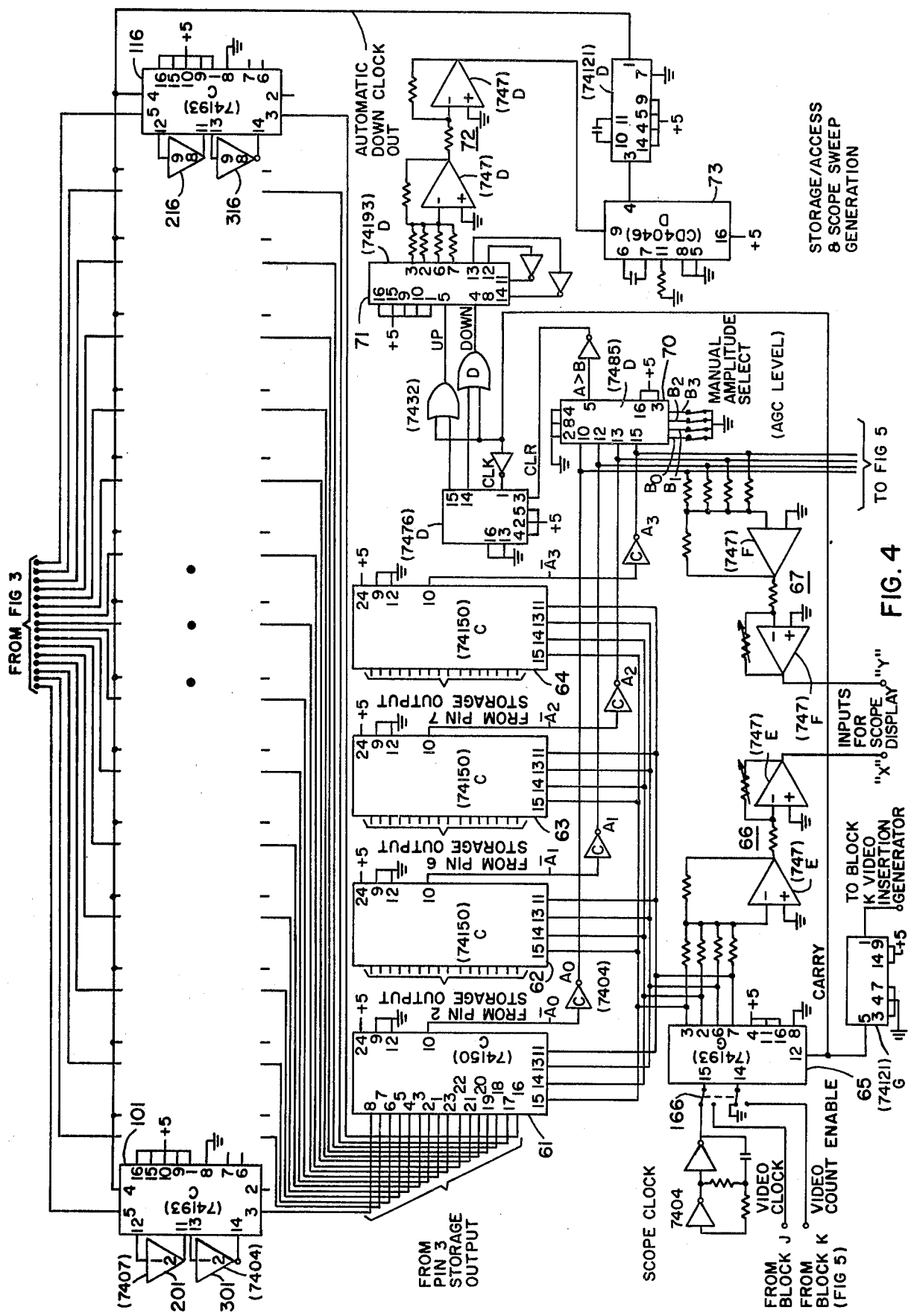
FIG. 4 is a detailed schematic illustration of further portions of FIG. 1.
Figure 5:
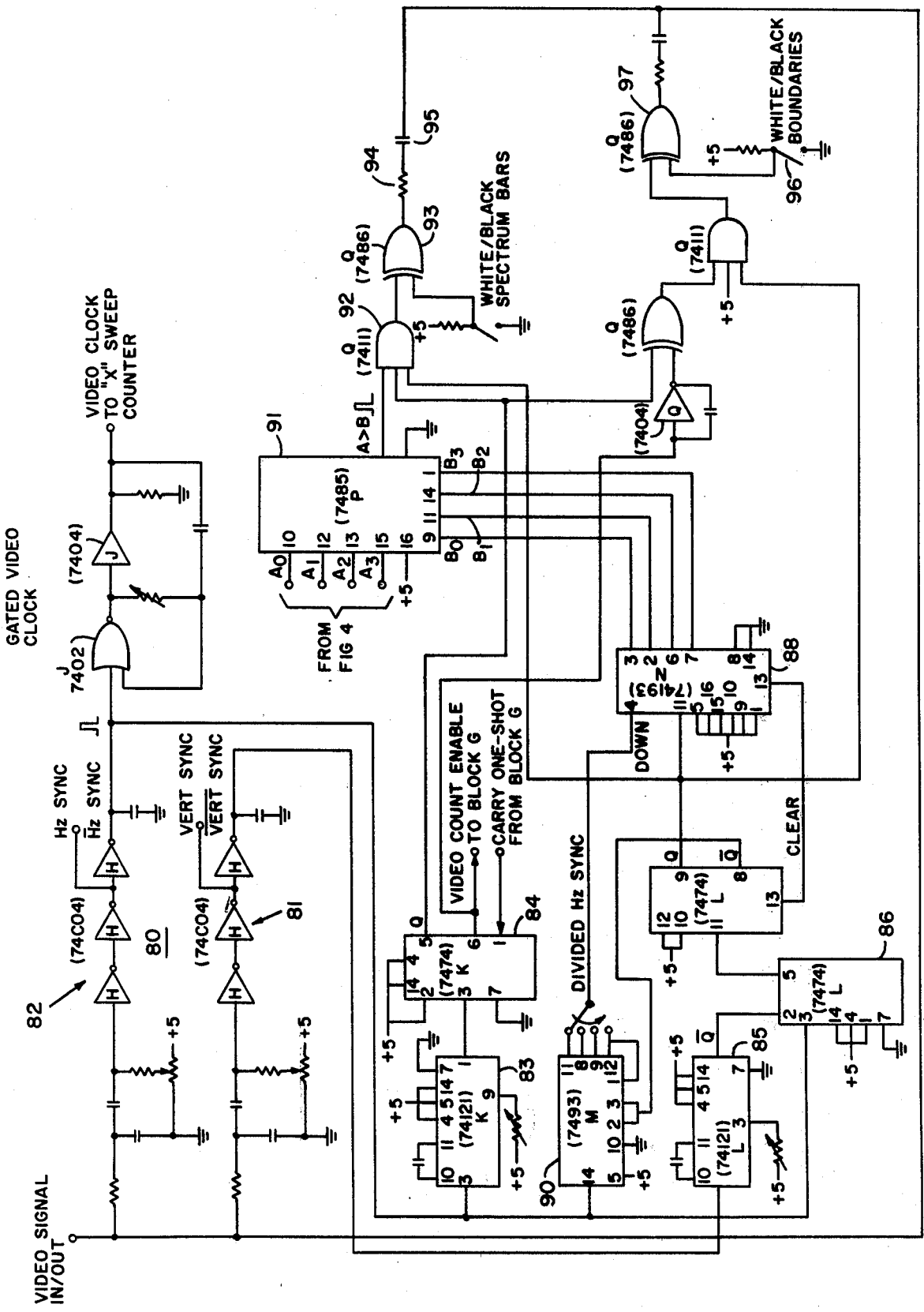
FIG. 5 is a detailed schematic diagram for portions of FIG. 2.

All components in the schematics of FIGS. 3, 4 and 5 are lettered to relate them to the portions of the block diagrams in FIGS. 1 and 2 of which they are a part, and the numbers in parenthesis are the chip identification both in the drawings and in the specification.

Referring to FIG. 3 the pulse width determining block consists of an initial pair 50 and 51 of shift registers (7495) which serially shift the incoming data pulses at the rate of the calibrated clock. Pulse widths are determined by clocking the primary counter (7493) 52 at a rate equal to the calibrated clock divided by sixteen (7493) 53. The clocking procedure takes place during each pulse duration and is reinitialized after each pulse. A buffer (7407) 54 was added to prevent the primary counter 52 from rolling-over. Pulse-widths are determined simply by the number of clock counts loaded into the primary counter 52 during the pulse duration. The larger the output of the counter is, the wider the pulse. The second to last and last serial shift register outputs are utilized to load each individual pulse width count from the primary counter into the bank of storage counter block C and to clear the primary counter after each pulse. This was done using a combination of D-type flip-flops (7474) 55 and 56 and a trailing edge one-shot (74121) 57. A variable externally calibrated clock 58 enables the user to analyze a wide range of pulse widths. Setting the clock at slower rates enables the analysis of a range of wider pulses; increasing the speed provides for studying narrower pulses widths.

Block B 60 is simply a 1 of 16 line decoder (74154). After each pulse width is counted, the four-bit binary output is present at the input of the decoder. This four-bit code specifies which of the sixteen storage counters will be clocked one time. This clocking takes place when the decoder 60 is strobed after each pulse. After strobing, the primary counter 52 is cleared and is ready for the next pulse. The storage counter with the largest output at any one time would indicate that its address or pulse width count was that of the dominant most occurring pulse width.

Referring to FIG. 4, the storage counter and access, is composed of sixteen individual storage counters (74193) 101–116 and their respective buffers (7407) 201–216 inverters (7404) 301–316 to prevent roll over in either direction (only end elements are shown in the drawing as they are duplicates) and four 16 to 1 line multiplexers (74150) 61–64. These multiplexers enable access to the output counts present on each storage counter when addressed by the X-sweep counter circuitry.

Access to the storage bank is provided by the use of a (74193) counter 65. This counter is driven at two different clock rates, both internally generated, and has two enable control lines which are switched in by switch 66 depending on whether the system is in the video or scope display mode. The output of X-sweep counter 65 serves two functions when operating in the scope display mode. The four-bit binary code counts from 0 to 15 repetitively and enters a D/A converter 66 to become the X-input to the scope. At the same time, the count is also used to address and gain access to each of the storage counter 61–64 outputs. These outputs enter another D/A converter 67 and become the Y-input to the scope.

To provide a true pulse width spectrum, the Y-axis must be the measure of the rate of occurrence of one pulse width over that of another. A pulse width that occurs more often will have a greater Y-value and all other widths will have a value indicative of their rate of occurrence in relation to the dominant pulse. In order to incorporate the above property to the spectrum, an automatic down clock configuration was built to increment the storage counters and makes up block D. In operation, the circuit keeps the different pulse widths at the correct ratio to each other as far as their rate of occurrence. The most commonly occurring pulse width controls the rate of the down clock. This clock automatically increments all of the storage counters downward at such a rate as to control the Y-value of the dominant pulse and keep it at a level manually selected by the user.

Assume that the user sets a binary value of 14 into the magnitude comparator (7485) 70. The outputs of each of the storage counters 61–64 are compared to this value during one sweep in the X-axis. The carry pulse of the X-sweep counter 65 is used to clock another (74193) 71 either up or down depending on whether the manually selected level was exceeded. The output of this counter is D/A converted by D/A converter 72 and drives a voltage-controlled oscillator 73, thus varying the down clock rate to all storage counters and keeping the dominant pulse level at the constant value selected. The Y-values of the other pulse widths will be relative to the dominant width as far as the rate of occurrence.

Referring to FIG. 5, the only additional signal required for operation of the insertion generator is the composite video from the camera electronics. The composite video enters a sync separator 80 block H, which separates the horizontal and vertical sync signals. The separator consists of two filtering RC combinations and inverting gates (74C04) 81 and 82. Blocks K and L are one-shot (74121) 83 and 85 and flip-flop (7474) 84 and 86 combinations that work off the horizontal and vertical sync signals. By varying the one-shot widths in these blocks, the spectrum can be positioned anywhere on the video screen. One-shot 83 triggers a (7474) 84 that enables the X-sweep counter (74193), (65 in FIG. 4) at a fixed point during each horizontal sweep. The X-sweep counter is clocked by a variable gated oscillator whose speed is set fast enough to enable the addressing of the sixteen storage counters between the X-sweep counter enable signal and the next horizontal sync. Increasing the speed of this clock will decrease the width of the plot. Using a faster clock also improves the response time of the automatic down clock and a more stable plot is the result.

As with the scope mode of operation, the X-sweep counter addresses the 16 storage counters. This addressing procedure takes place during every horizontal sweep. A down counter 88 block N, counts from 15 to 0 once during the vertical duration of the spectrum. A divided down horizontal sync signal is used to drive this down counter. The speed of this divided down clock adjusts the overall height of the spectrum. The division is accomplished by a divide by 2, 4, 8, or 16 counter (7493) 90. The binary output of the down counter is compared 91, block P, to the magnitude of each of the storage counter outputs every time the down counter is clocked, i.e., every 2, 4, 8, or 16 horizontal sync pulses. If a storage counter output is greater than the down counter output, a pulse is generated and gated to provide a video signal. The simple gating consists of an "AND" gate (7411) 92 and an "EXCLUSIVE OR" gate (7486) 93 followed by a 1 KΩ resistor 94 and 0.47 μf capacitor 95 series combination which enables coupling of the signal back into the video input line.

By using the A > B output of the magnitude comparator 91 a graph spectrum results rather than a point-by-point spectrum as generated in the scope mode of operation. Some additional gates are used to provide thin vertical bars marking the minimum and maximum pulse width bounderies. Both the boundary markers and vertical spectrum bars can be white or black as desired by using a switch 96 and (7486) gate 97 as shown.

Figure 6:
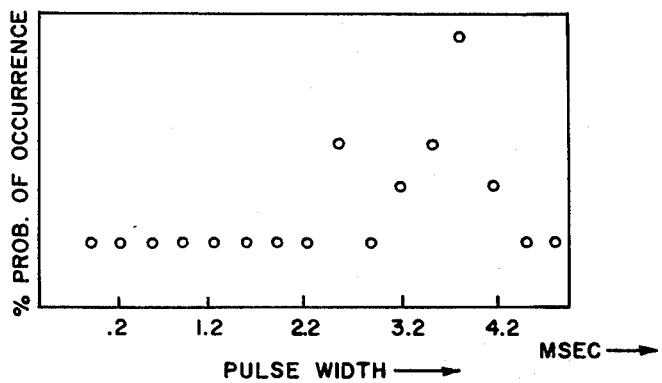
FIG. 6 is a graph illustrating a scope readout of the present invention.
Figure 7:
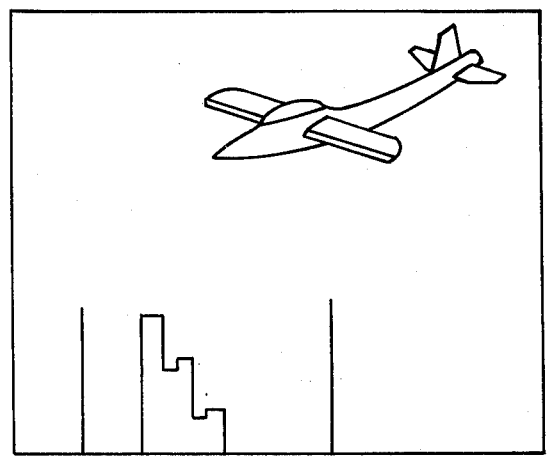
FIG. 7 is an illustration of the graphs superimposed on a video picture.

FIGS. 6 and 7 demonstrate the operation of the pulse width spectrum analyzer. Operating in the scope display mode, pulse settings of various widths were fed into the circuit and the following spectrums obtained.

The spectrums of FIG. 6 were obtained using pulse generators for both the data line input and the calibrated external clock. The speed of the external clock was set so that each horizontal increement represents about 0.33 m sec. Varying the speed of the external clock adjusted the operating range of the spectrum. That is, in FIG. 6 the external clock was set so that each horizontal division represented about 0.33 m sec. Using this clock rate, only pulse widths in the range of 0.2 m sec to 5.5 m sec. could be distinguished between and represented. Signals with dominant pulse widths smaller than about 0.2 m sec. Would result in the leftmost or minimum pulse width position being maximum. Likewise for signals whose dominant pulse widths are larger than about 5.5 m sec. the maximum pulse width position would be of highest amplitude. The external clock speed should be selected so that the pulse widths of interest will be within the dynamic range of the analyzer. Of course by adding additional counters to the pulse width counting circuitry and enlarging the storage capability of the circuit, a larger active range can be obtained.

FIG. 7 shows the spectrum as it is displayed in the video mode of operation. The pulse information is positioned in the lower left.

We claim:

1. A pulse width spectrum analyzer for analyzing the pulse widths of a source of random pulse width data comprising a pulse width determining means having as its input said source of random pulse width data and having outputs whose magnitudes are directly portional to the widths of the input pulse width data; a plurality of storage counters; first means for directing the outputs of said pulse width determining means to a selected storage counter in accordance with its magnitude; a sweep counter connected to said storage counters so as to cause the storage counters to serially present outputs as the sweep counter counts; electronic display means having an X-input and a Y-input for representing a graph display in accordance to its inputs; said sweep counter having its output connected to the X-input of said display means; and said storage counters having their outputs connected to the Y-input of the display means.

2. An analyzer as set forth in claim 1 wherein said sweep counter is repetitively swept so as to cause continuous input to said display means.

3. An analyzer as set forth in claim 1 wherein said sweep counter is selectively recycled so as to cause the spectrum analyze, as information to be displayed only on a selective portion of said display means.

4. An analyzer as set forth in claim 2 or 3 further comprising an automatic down counting means having inputs connected to the outputs of said storage counters; and said automatic down counting means having outputs connected to said counters for causing each storage counter to count down when the automatic down counter means receives an input from any one of said storage counters of a magnitude equal to a predetermined magnitude.

5. An analyzer as set forth in claim 4 wherein said first means is a clocking means which is strobed and clocks one of the storage counters once each strobe; and said storage counter to be clocked is determined by the magnitude of the output from said pulse width determining means.

6. In a pulse width spectrum analyzer for analyzing a source of random pulse width data the improvement comprising the method of determining the pulse width of each pulse of the incoming data; providing a plurality of storage counters in accordance to the number of different pulse widths to be analyzed; causing a corresponding counter to count one time each time it is determined that the corresponding pulse width has been determined to be an input from the pulse width data; accumulating the information in the storage counters; reading out the information from said storage counter in a serial fashion; and displaying said pulse information in a chart format by using the serial fashion of reading out of the storage counter as the X-input and using the magnitude of the count on the storage counter as the Y-input.

7. An analyzer as set froth in claim 6 further determining when any storage counter reaches a count of a predetermined value and causing a one down counter of all storage counters upon this occurrence.

8. An analyzer as set forth in claim 7 wherein a serial reading of said storage counters is done selectively and periodically so as to cause the information output to be selectively located in a portion of a display means.

* * * * *